(12) United States Patent
Polyak et al.

(10) Patent No.: US 10,415,137 B2
(45) Date of Patent: Sep. 17, 2019

(54) NON-METALLIC THERMAL CVD/ALD GAS INJECTOR AND PURGE SYSTEMS

(71) Applicant: Applied Materials, Inc., Santa Clara, CA (US)

(72) Inventors: Alexander S. Polyak, Palm Coast, FL (US); Joseph Yudovsky, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 316 days.

(21) Appl. No.: 15/392,489

(22) Filed: Dec. 28, 2016

(65) Prior Publication Data
US 2017/0191159 A1 Jul. 6, 2017

Related U.S. Application Data

(60) Provisional application No. 62/274,238, filed on Jan. 1, 2016.

(51) Int. Cl.
C23C 16/455 (2006.01)
C23C 16/54 (2006.01)
C23C 16/44 (2006.01)
C23C 16/46 (2006.01)
H01L 21/02 (2006.01)

(52) U.S. Cl.
CPC .... C23C 16/45544 (2013.01); C23C 16/4401 (2013.01); C23C 16/4408 (2013.01); C23C 16/45551 (2013.01); C23C 16/45563 (2013.01); C23C 16/45572 (2013.01);
(Continued)

(58) Field of Classification Search
None
See application file for complete search history.

(56) References Cited

U.S. PATENT DOCUMENTS 6,972,055 B2 12/2005 Sferlazzo
2008/0017104 A1 1/2008 Matyushkin
(Continued)

FOREIGN PATENT DOCUMENTS

JP 2009147372 A 7/2009
JP 2016056410 A 4/2016
(Continued)

OTHER PUBLICATIONS

PCT International Search Report and Written Opinion in PCT/US2016/068875 dated Apr. 17, 2017, 10 pages.
(Continued)

Primary Examiner — Karla A Moore
(74) Attorney, Agent, or Firm — Servilla Whitney LLC

(57) ABSTRACT

Gas distribution assemblies and processing chambers using same are described. The gas distribution assemblies comprise a cooling plate with a quartz puck, a plurality of reactive gas sectors and a plurality of purge gas sectors suspended therefrom. The reactive gas sectors and purge gas sectors having a coaxial gas inlet with inner tubes and outer tubes, the inner tubes and outer tubes in fluid communication with different gas or vacuum ports in the front faces of the sectors. The sectors may be suspended from the cooling plate by a plurality of suspension rods comprising a metal rod body with an enlarged lower end positioned within a quartz frame with a silicon washer around the enlarged lower end.

10 Claims, 16 Drawing Sheets

(52) U.S. Cl.
CPC ...... *C23C 16/45576* (2013.01); *C23C 16/463* (2013.01); *C23C 16/54* (2013.01); *H01L 21/0262* (2013.01)

(56) References Cited

U.S. PATENT DOCUMENTS

| | | | |
|---|---|---|---|
| 2009/0151632 A1 | 6/2009 | Okuda | |
| 2009/0304924 A1* | 12/2009 | Gadgil | C23C 16/4412 427/255.5 |
| 2010/0050942 A1* | 3/2010 | Kato | C23C 16/401 118/730 |
| 2015/0107772 A1 | 4/2015 | Uchida | |
| 2015/0136028 A1* | 5/2015 | Park | C23C 16/45551 118/730 |
| 2015/0376786 A1 | 12/2015 | Yudovsky et al. | |
| 2016/0068952 A1 | 3/2016 | Sasaki | |

FOREIGN PATENT DOCUMENTS

| | | |
|---|---|---|
| KR | 20140012242 A | 2/2014 |
| KR | 20140049170 A | 4/2014 |

OTHER PUBLICATIONS

PCT International Preliminary Report on Patentability in PCT/US2016/068875 dated Jul. 12, 2018, 7 pages.

* cited by examiner

NON-METALLIC THERMAL CVD/ALD GAS INJECTOR AND PURGE SYSTEMS

CROSS-REFERENCE TO RELATED APPLICATIONS

This application claims priority to U.S. Provisional Application No. 62/274,238, filed Jan. 1, 2016, the entire disclosure of which is hereby incorporated by reference herein.

TECHNICAL FIELD

The present disclosure relates generally to gas distribution apparatus for processing chambers. In particular, the disclosure relates to high temperature quartz gas distribution assemblies for batch processing chambers.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Typical processing chambers use machined aluminum or metal components for the gas distribution assemblies. Metal components are often too thermally conductive for high temperature processes and can melt and/or leach contaminants at high temperatures. Additionally, the high thermal conductivity of metal injectors leaches heat away from the process region resulting in a need to use increased power levels for the heating elements. Accordingly, there is a need in the art for improved injectors for batch processing chambers that are less thermally conductive and are less likely to contaminate the process being performed.

SUMMARY

One or more embodiments of the disclosure are directed to gas distribution assemblies comprising a cooling plate, a plurality of reactive gas sectors axially arranged around a central axis, a plurality of purge gas sectors axially arranged around the central axis and a quartz puck at the central axis. Each of the purge gas sectors are positioned between reactive gas sectors.

Additional embodiments of the disclosure are directed to gas distribution assemblies comprising a cooling plate having a conductive body with a channel therethrough to flow a fluid from an inlet end of the channel to an outlet end of the channel.

A plurality of reactive gas sectors are axially arranged around a central axis. Each of the reactive gas sectors comprises a quartz wedge-shaped housing with a back face, a front face and a coaxial gas inlet in fluid communication with the wedge-shaped housing. The coaxial gas inlet has an inner tube and an outer tube. The inner tube is in fluid communication with a plenum within the wedge-shaped housing and the reactive gas sector includes a diffuser plate adjacent the plenum. The diffuser plate comprises a plurality of apertures to allow a gas flowing through the inner tube to pass into the plenum and diffuse through the plurality of apertures and out the front face of the wedge-shaped housing into a process region of the processing chamber. The outer tube is in fluid communication with a vacuum port in the front face of the wedge-shaped housing. The vacuum port surrounds the diffuser plate of the reactive gas port. Each reactive gas sector is suspended from the cooling plate by at least three suspension rods. Each suspension rod comprises a metal rod body that passes through an opening in the back face of the wedge-shaped housing. The rod body has an enlarged lower end positioned within a quartz frame within the wedge-shaped housing. A silicon washer is positioned within the quartz frame around the enlarged lower end.

A plurality of purge gas sectors are axially arranged around the central axis. Each of the purge gas sectors is positioned between reactive gas sectors and comprises a quartz housing with a back face, a front face, an outer peripheral leg, a radial leg and a coaxial gas inlet in fluid communication with the housing. The coaxial gas inlet has an inner tube and an outer tube. The inner tube is in fluid communication with a purge gas port in the front face of the radial leg of the housing. The outer tube is in fluid communication a purge gas port in the front face of the outer peripheral leg of the housing. Each of the purge gas sectors is suspended from the cooling plate by at least two suspension rods. Each suspension rod comprises a metal rod body that passes through an opening in the back face of the housing. The rod body has an enlarged lower end positioned within a quartz frame within the housing. A silicon washer is positioned within the quartz frame around the enlarged lower end.

A quartz puck is at the central axis. The plurality of reactive gas sectors and purge gas sectors are alternatingly arranged around an outer edge of the quartz puck. The quartz puck comprises at least one vacuum port and at least one purge gas port. The quartz puck is suspended from the cooling plate by a plurality of suspension rods. Each suspension rod comprises a metal rod body that passes through an opening in a back face of the housing. The rod body has an enlarged lower end positioned within a quartz frame within the housing. A silicon washer is positioned within the quartz frame around the enlarged lower end.

Further embodiments of the disclosure are directed to processing chambers comprising a gas distribution assembly and a susceptor assembly. The gas distribution assembly comprising a cooling plate, a quartz puck, a plurality of reactive gas sectors and a plurality of purge gas sectors. The quartz puck is suspended from a central axis of the cooling plate by a plurality of suspension rods. The quartz puck comprises at least one vacuum port and at least one purge gas port in a front face of the quartz puck.

The plurality of reactive gas sectors are axially arranged around an outer edge of the quartz puck. Each reactive gas sector is suspended from the cooling plate by at least three suspension rods. Each of the reactive gas sectors comprises a quartz wedge-shaped housing with a back face, a front face and a coaxial gas inlet in fluid communication with the wedge-shaped housing. The coaxial gas inlet has an inner tube and an outer tube. The inner tube is in fluid communication with a plenum within the wedge-shaped housing and the reactive gas sector includes a diffuser plate adjacent the plenum. The diffuser plate comprises a plurality of apertures to allow a gas flowing through the inner tube to pass into the plenum and diffuse through the plurality of apertures and out the front face of the wedge-shaped housing into a process region of the processing chamber. The outer tube is in fluid communication with a vacuum port in the front face of the wedge-shaped housing. The vacuum port surrounds the diffuser plate of the reactive gas port.

The plurality of purge gas sectors are axially arranged around the outer edge of the quartz puck and alternate with the reactive gas sectors. Each purge gas sector comprises a quartz housing with a back face, a front face, an outer peripheral leg, a radial leg and a coaxial gas inlet in fluid communication with the housing. The coaxial gas inlet has an inner tube and an outer tube. The inner tube is in fluid communication with a purge gas port in the front face of the radial leg of the housing. The outer tube is in fluid communication a purge gas port in the front face of the outer peripheral leg of the housing.

Each suspension rod comprises a metal rod body that passes through an opening in the back face of the housing. The rod body has an enlarged lower end positioned within a quartz frame within the housing and a silicon washer is positioned within the quartz frame around the enlarged lower end.

The susceptor assembly has a top surface comprising a plurality of recesses therein. Each recess is sized to support a substrate. The susceptor assembly has a support post to rotate and move the susceptor assembly to form a gap between the gas distribution assembly and the top surface of the susceptor assembly to form a gap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
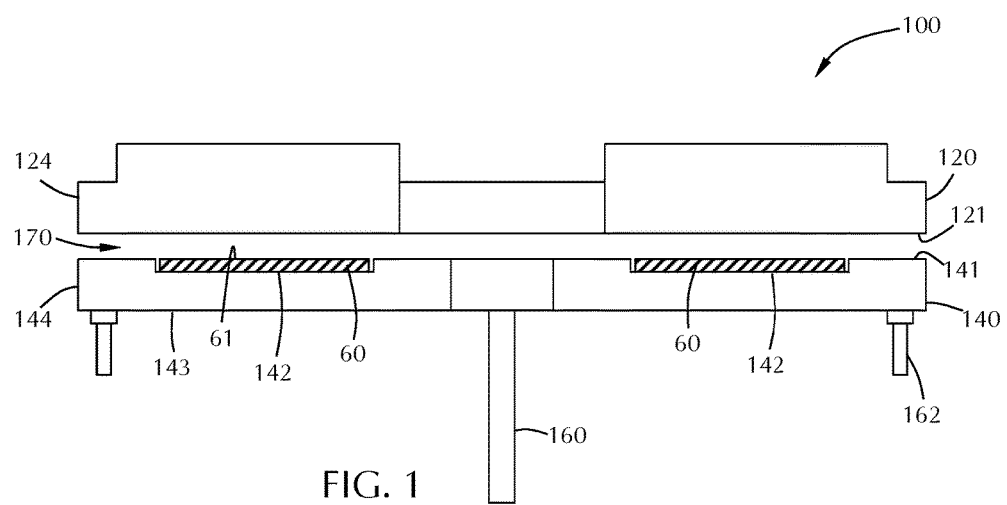
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
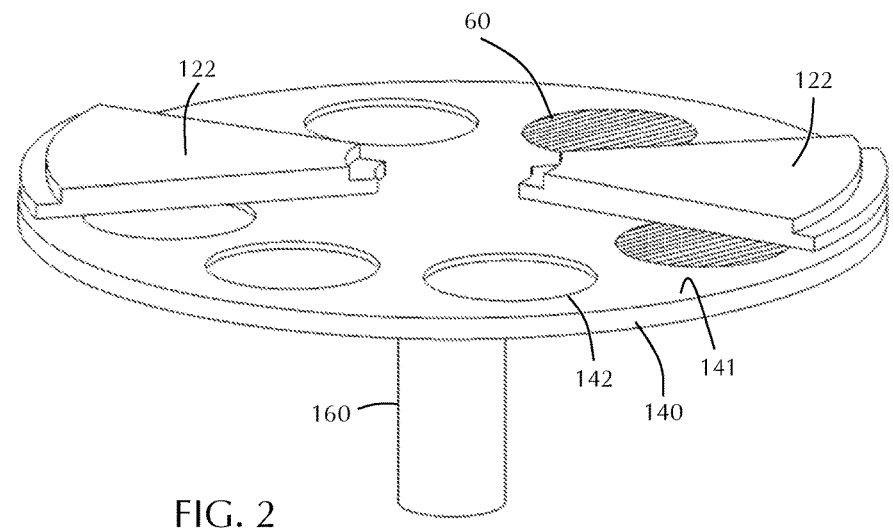
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
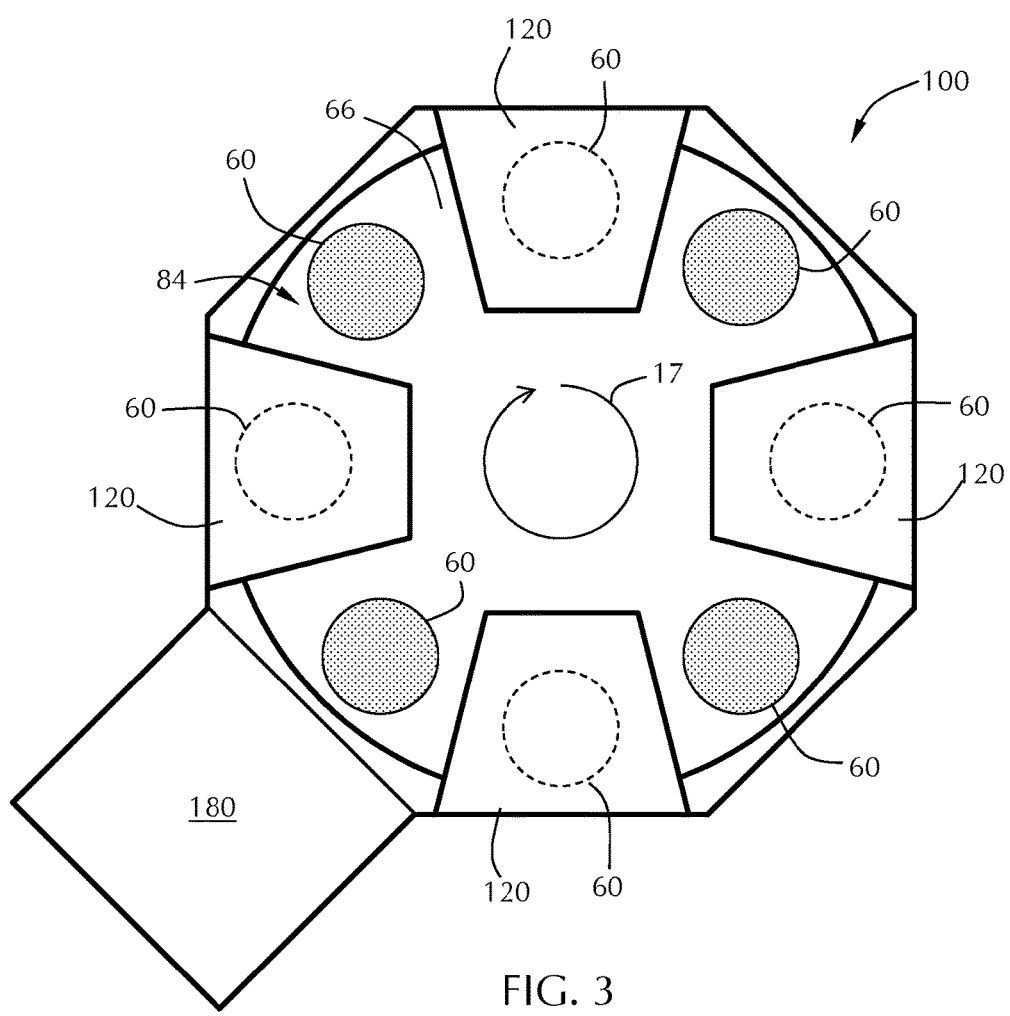
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to a gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
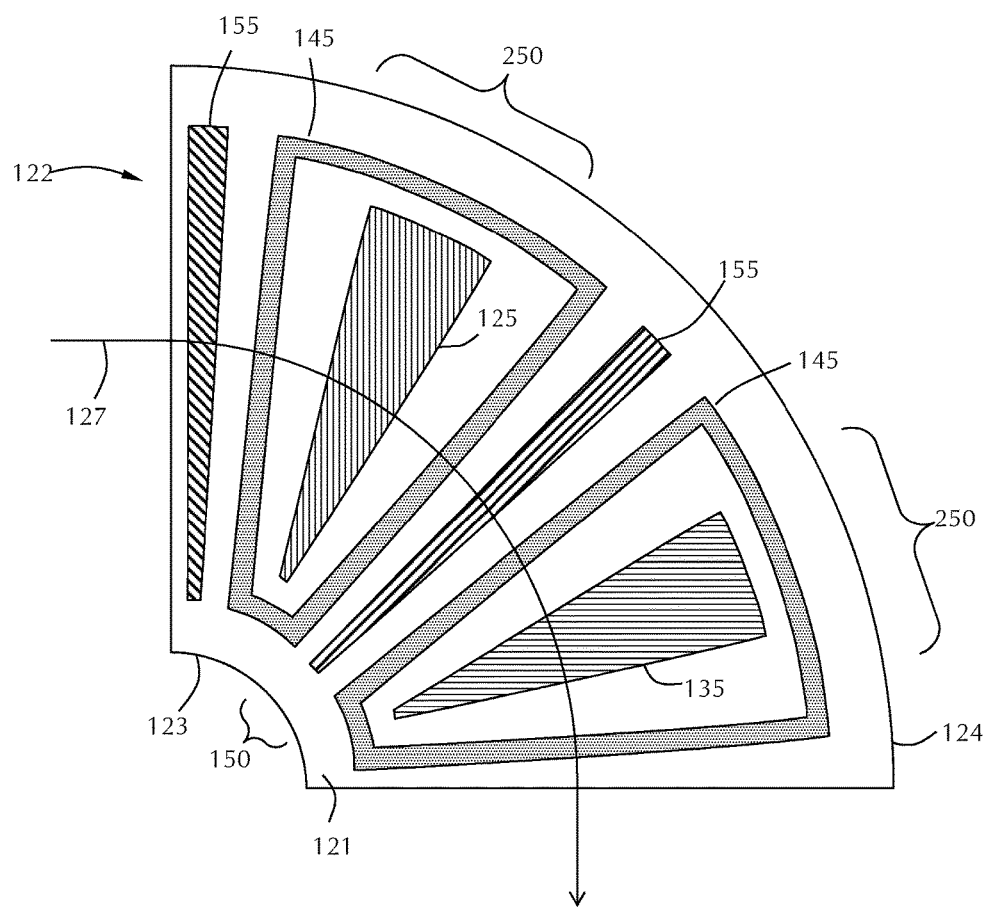
FIG. 4 shows a schematic view of a portion of a wedge shaped gas distribution assembly for use in a batch processing chamber in accordance with one or more embodiment of the disclosure.
Figure 5:
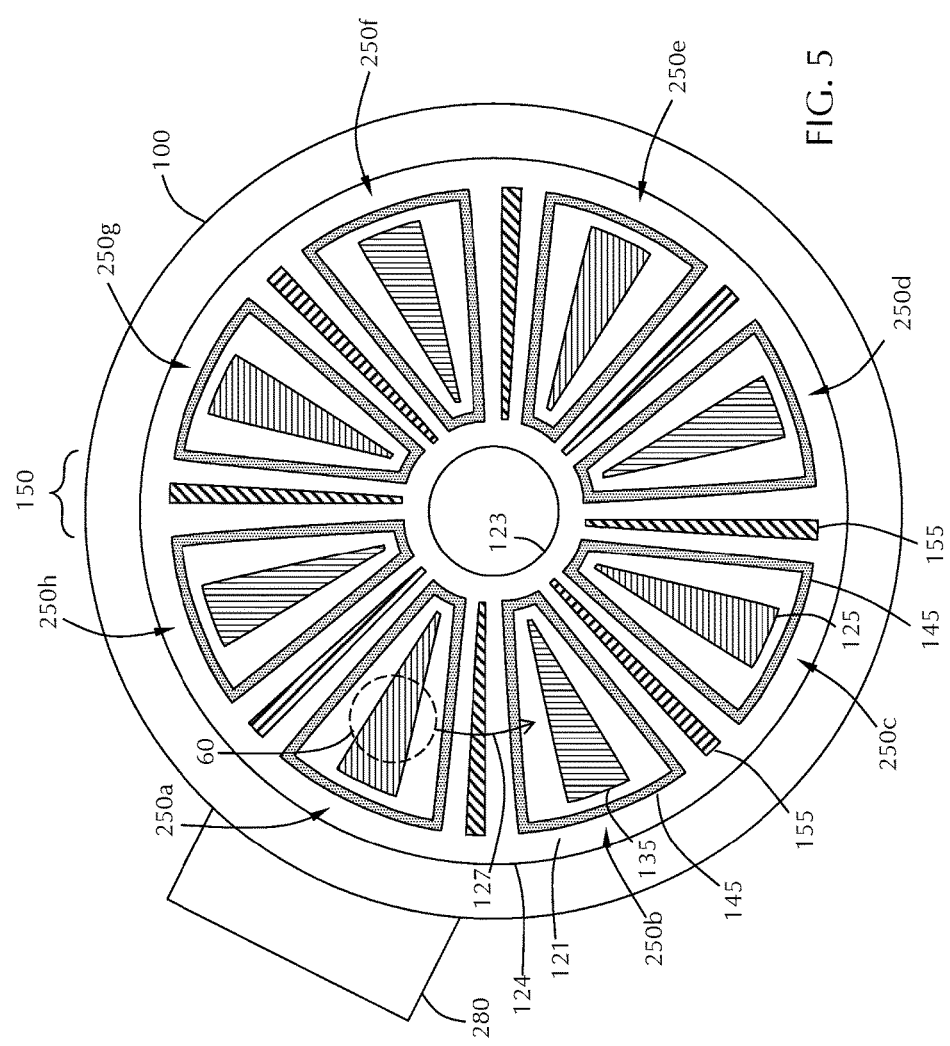
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas and the second reactive gas to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250b through process region 250h, an inert gas would be flowing into process region 250a. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

Some embodiments of the disclosure are directed to gas distribution assemblies comprising a circular array of non-metallic sectors for precursor gas injection and vacuuming and an array of purge sectors providing both process and peripheral purge. Some embodiments include separate central vacuum/purge inserts within independent purge gas injection and vacuum facility. Introduction of media into injectors and purge sectors may be accomplished through a coaxial piping arrangement. In some embodiments, the various sectors are flexibly suspended from a structural cooling plate of the chamber top.

One or more embodiments advantageously provide non-metallic sectors that provide gas flow with minimal or no metal contamination. Some embodiments advantageously provide gas injectors that are usable at high temperatures which may not be possible with traditional component materials due to melting and leaching issues. Some embodiments advantageously provide injector components with lower thermal conductivity allowing use of lower power for heating.

Figure 6:
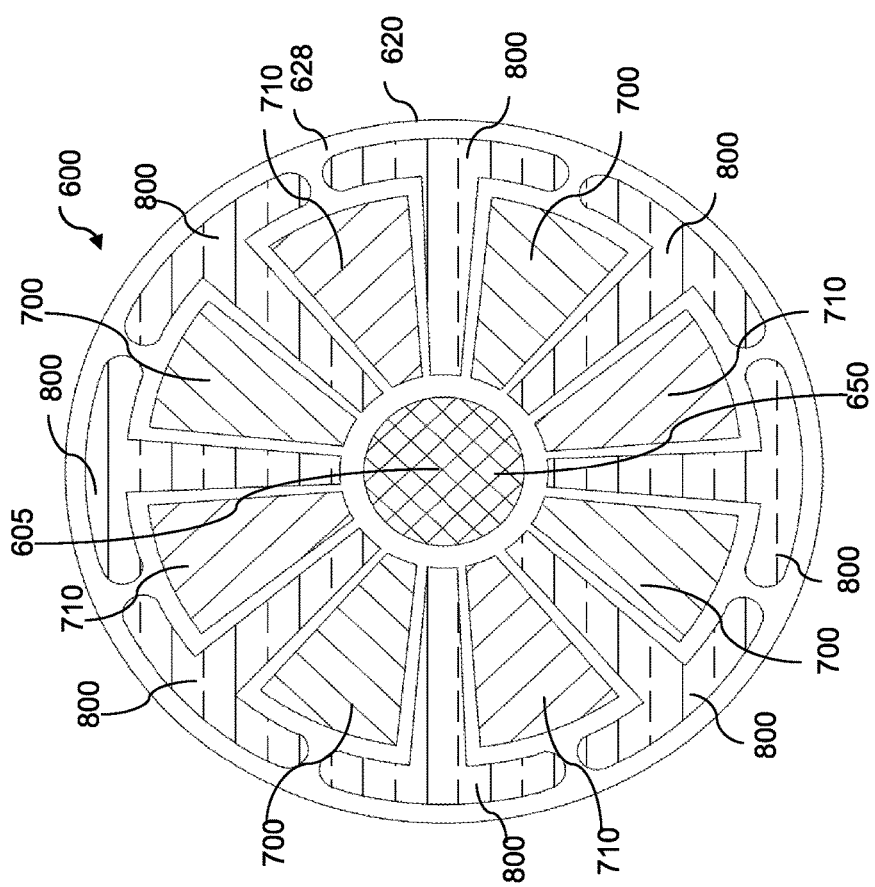
FIG. 6 shows a schematic front view of a gas distribution assembly in accordance with one or more embodiment of the disclosure.

Referring to FIG. 6, some embodiments of the gas distribution assembly 600 comprise a cooling plate 620 with a plurality of reactive gas sectors 700, 710 and a plurality of purge gas sectors 800 axially arranged around a central axis 605. In the embodiment shown, reactive gas sectors 700 and reactive gas sectors 710 deliver different gases and may be made from the same or different materials.

Figure 7:
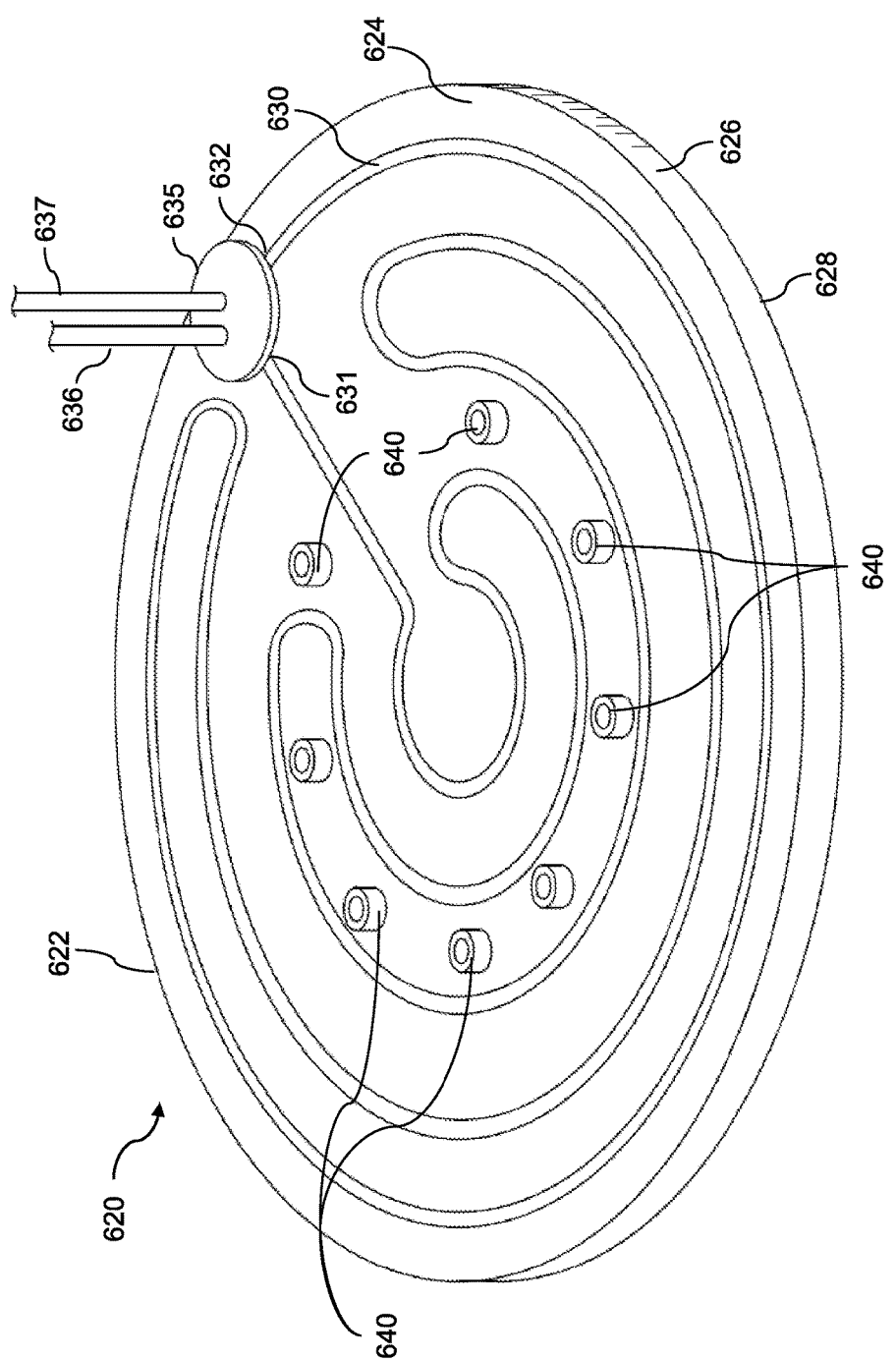
FIG. 7 shows a perspective view of a cooling plate in accordance with one or more embodiment of the disclosure.

FIG. 7 shows a cooling plate 620 in accordance with one or more embodiment of the disclosure. The cooling plate 620 includes a thermally conductive body 622 with a top surface 624, sidewall 626 and bottom surface 628.

The conductive body 622 of some embodiments has a channel 630 extending through the plate to allow a flow of fluid to cool the conductive body 622. The channel 630 can be embedded within the body of the cooling plate 620 or formed as a recessed channel which is covered by a backing plate. The channel may extend from an inlet end 631 to an outlet end 632 following a circuitous route through or across the conductive body 622 to ensure that the body 622 is uniformly cooled by the fluid flowing through the channel 630. The inlet end 631 and outlet end 632 can connect to a fluid hub 635 which allow fluid communication with an inlet line 636 and outlet line 637.

The conductive body 622 can be made of any suitable thermally conductive material. Suitable materials include, but are not limited to, aluminum and stainless steel. In some embodiments, the conductive body 622 comprises aluminum.

Figure 8:
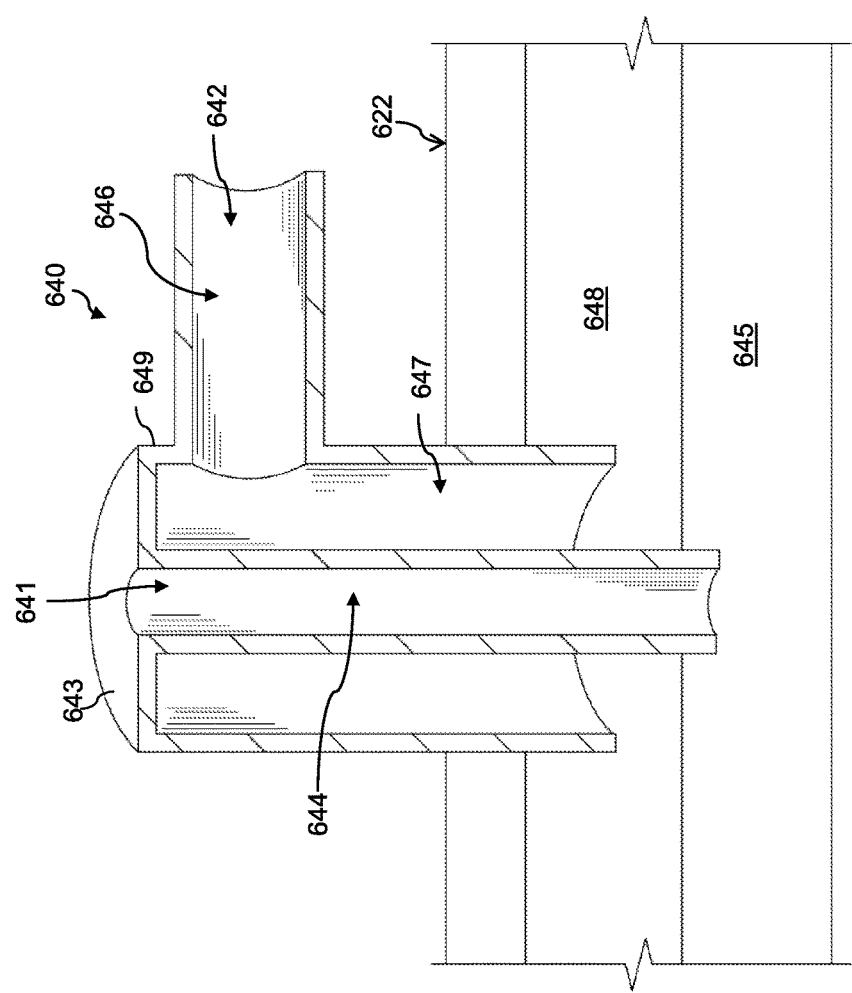
FIG. 8 shows a partial cross-sectional view of a gas connection in accordance with one or more embodiment of the disclosure.

A plurality of gas connections 640 can be connected to the top surface 624 of the conductive body 622. The gas connections 640 can be configured to allow one or more fluid lines to be attached to the connections 640 to allow a flow of fluid (e.g., reactive gas, purge gas, vacuum) to pass through the conductive body 622. FIG. 8 shows a cross-section of an embodiment of a gas connection 640 with two inlets 641, 642 that flow into a coaxial gas feed. A first gas source (not shown) or vacuum can be connected to the first inlet 641 on the top 643 of the gas connection 640. The gas can flow through the first inlet 641 into inner tube 644 and into region 645. A second gas source (not shown) or vacuum can be connected to the second inlet 642 on the side 649 of the gas connection 640. The gas can flow through the second inlet 642 into leg 646 and outer tube 647 into region 648. This allows two different gases or vacuum or combination of gas/vacuum to be connected to a single gas connection 640 and allow fluid communication between regions 645, 648 which are isolated from each other. The gas connection 640 shown in FIG. 8 is exemplary of one possible connection and should not be taken as limiting the scope of the disclosure. Those skilled in the art will understand that other gas connections and connection configurations are within the scope of the disclosure.

Figure 10:
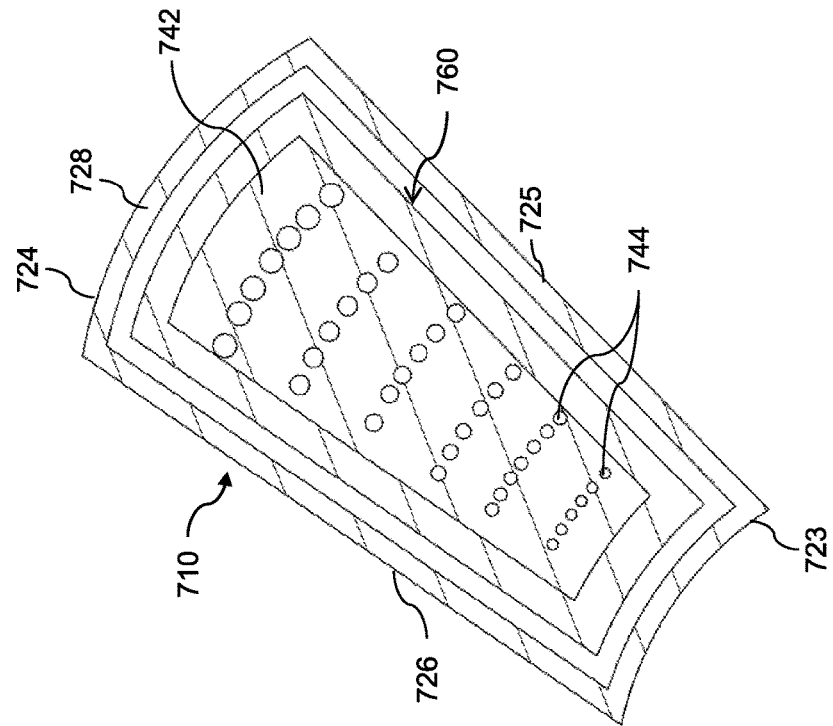
FIG. 10 shows a front face of a reactive gas port in accordance with one or more embodiment of the disclosure.
Figure 9:
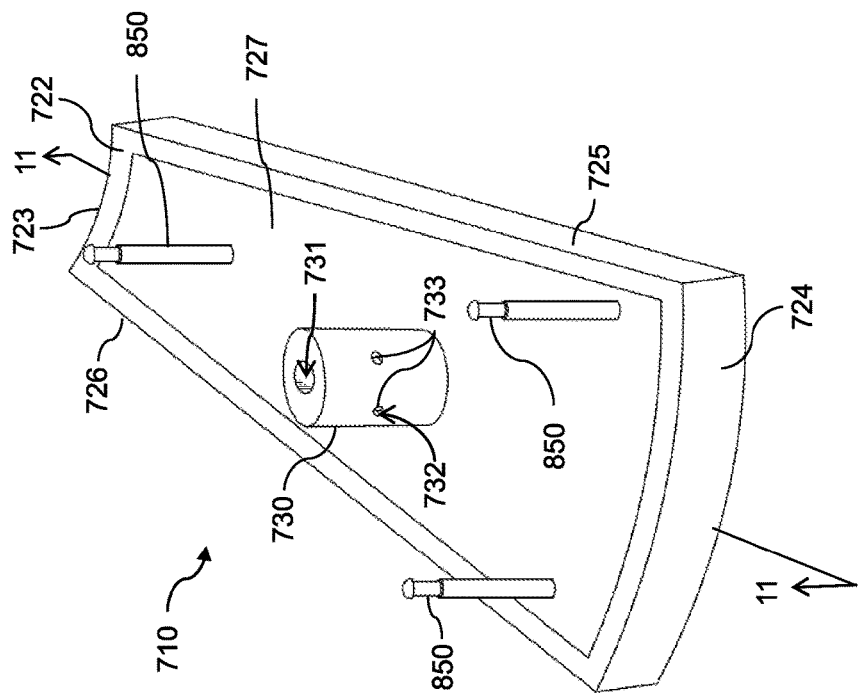
FIG. 9 shows a top perspective view of a reactive gas port in accordance with one or more embodiment of the disclosure.
Figure 11:
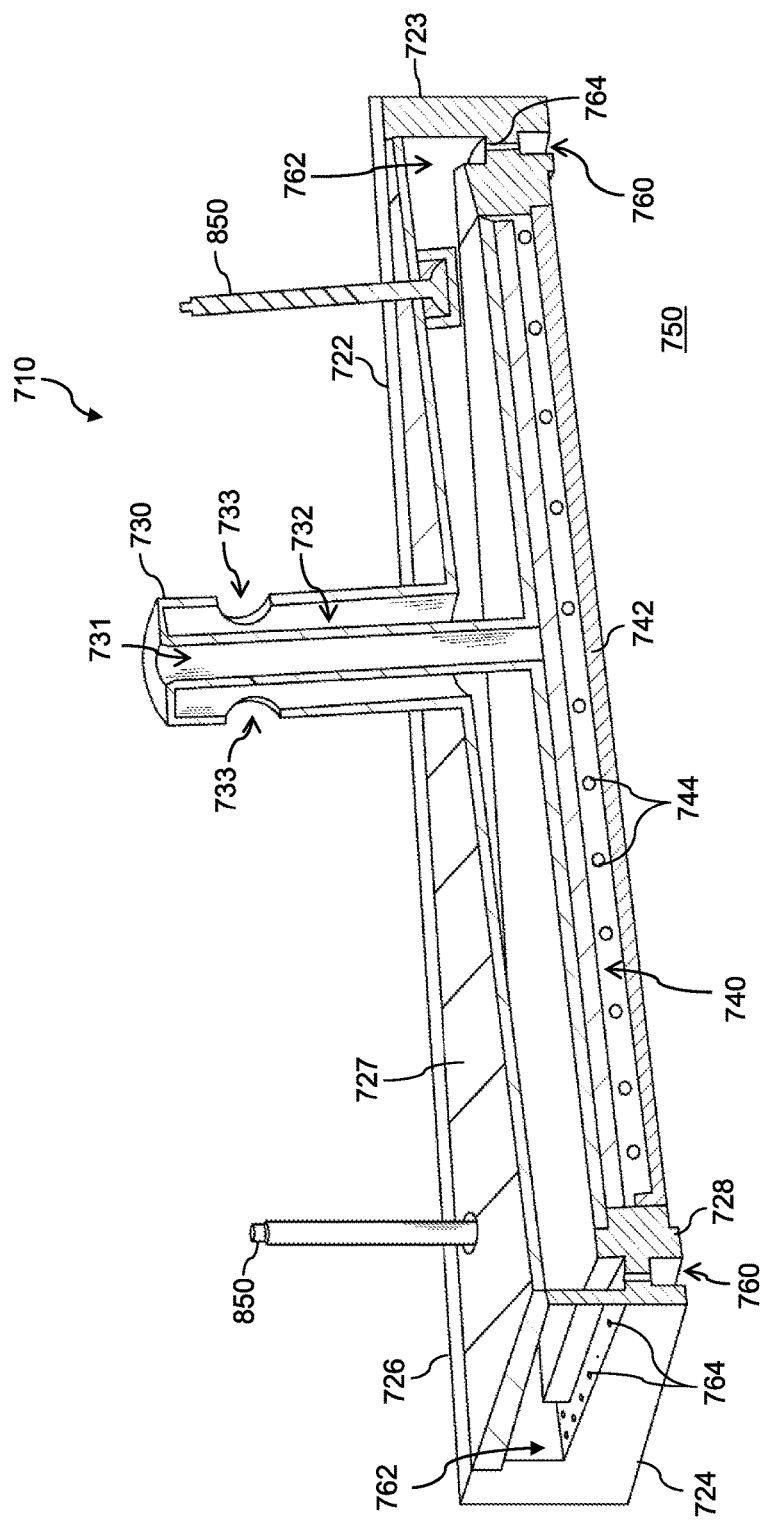
FIG. 11 shows a cross-sectional view of the reactive gas port of FIG. 9 taken along line 11-11.

FIGS. 9 through 11 show embodiments of a reactive gas sector 710. The reactive gas sector 710 can be structurally identical to reactive gas sector 720 (shown in FIG. 6) or have different structures, dimensions, etc. The reactive gas sector 710 has a wedge-shaped housing 722 with an inner peripheral end 723, outer peripheral end 724, first side 725, second side 726, back face 727 and front face 728.

A coaxial gas inlet 730 is in fluid communication with the wedge-shaped housing 722 and is shown connected to the back face 727. The coaxial gas inlet 730 has an inner tube 731 and an outer tube 732. The coaxial gas inlet 730 can have a similar configuration to the gas connection 640 shown in FIG. 8. In some embodiments, the coaxial gas inlet 730 passes through the conductive body 622 of the cooling plate 620 and acts as both the gas connection 640 and the coaxial gas inlet 730.

The inner tube 731 is in fluid communication with a plenum 740 within the wedge-shaped housing 722. A diffuser plate 742 is located adjacent the plenum 740 and includes a plurality of apertures 744 to allow a gas flowing through the inner tube 731 to pass into the plenum 740 and diffuse through the plurality of apertures 744 in the diffuser plate 742 and out the front face 728 of the wedge-shaped housing 722 into a process region 750 of the processing chamber. The process region 750 is a region located adjacent the front face 728 of the wedge-shaped housing 722 where the surface reactions with the substrate can occur.

The outer tube 732 is in fluid communication with a vacuum port 760 in the front face 728 of the wedge-shaped housing 722. A plurality of annular openings 733 in a side of the coaxial gas inlet 730 allow for coaxial connection of different gas streams (e.g., reactive gas and vacuum) in the inner tube 731 and outer tube 732. As shown in FIG. 10, the vacuum port 760 surrounds the diffuser plate 742 of the reactive gas port 710. This configuration helps to minimize reactive species from diffusing from the process region 750 into other areas of the processing chamber. As shown in the partial-cross sectional view of FIG. 11, the vacuum port 760 is in fluid communication with the outer tube 732 through plenum 762 and apertures 764. The outer tube 732 can be welded to the inner tube 731 at the top of the coaxial gas inlet 730.

In some embodiments, each of the individual layers of the reactive gas sector 710 is made of quartz and are assembled and fused into a single component. The use of quartz for the layers of the reactive gas sector 710 minimizes the chances of metal contamination.

Figure 12:
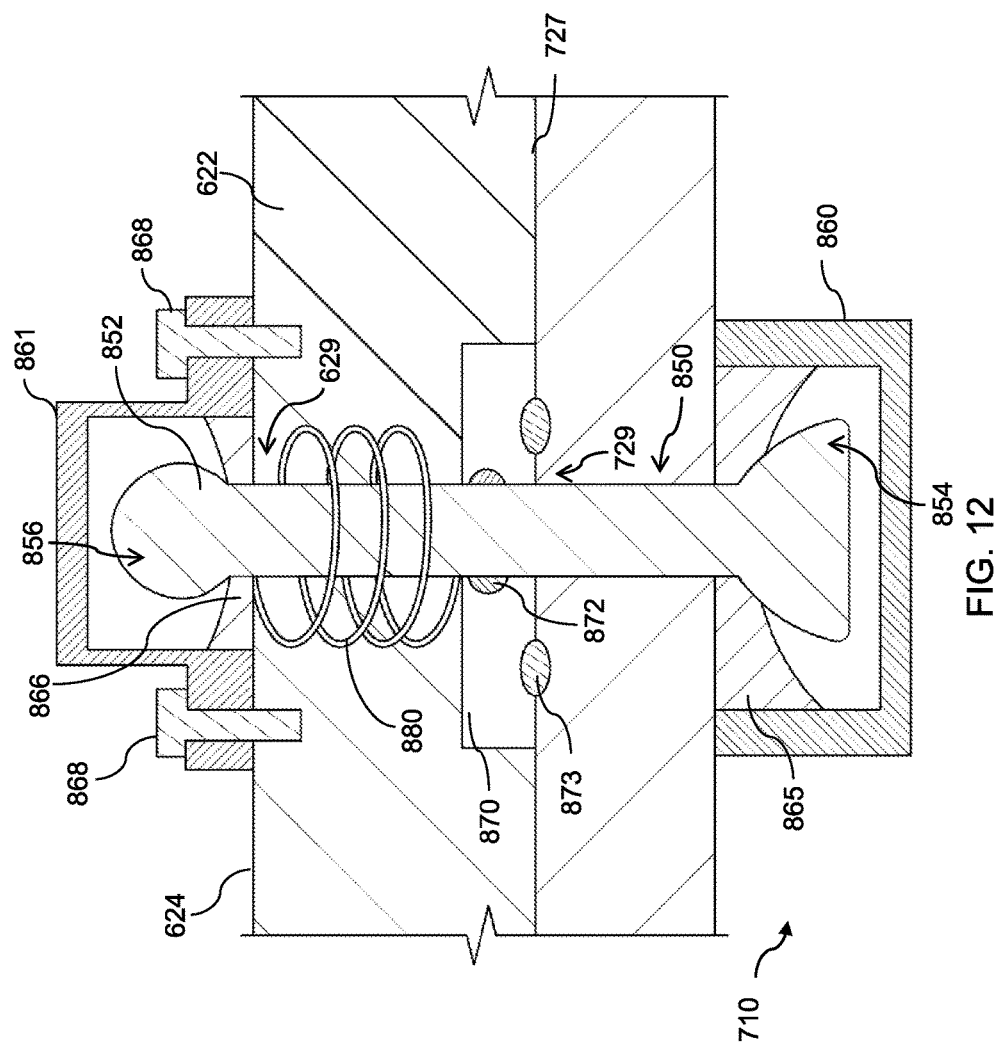
FIG. 12 shows a partial cross-sectional view of a suspension rod in accordance with one or more embodiment of the disclosure.

Each of the reactive gas sectors 710, 720 are suspended from the cooling plate 620 by a plurality of suspension rods 850. The suspension rod of some embodiments incorporates an encapsulated ball joint to suspend the sector and allow movement of the sector relative to the cooling plate to accommodate, for example, thermal expansion. FIG. 12 shows an embodiment of a suspension rod 850 comprising a metal rod body 852 that passes through an opening 729 in the back face 727 of the wedge-shaped housing 722. In the embodiment shown in FIG. 12, the rod body 852 also extends through an opening 629 in the conductive body 622 of the cooling plate 620. Those skilled in the art will understand that this is merely representative of one possible configuration and should not be taken as limiting the scope of the disclosure.

The rod body 852 can be made of any suitable material that can support the weight of the sector and withstand temperature fluctuations encountered within the processing chamber. Suitable materials for the rod body 852 include, but are not limited to, tungsten, molybdenum, or other high temperature metal that can withstand the fusion process used to assembly the sector components.

The rod body 852 has an enlarged lower end 854 which is positioned within a quartz frame 860 within the wedge-shaped housing 722. A washer 865 is positioned within the quartz frame 860 and extends around the enlarged lower end 854 of the rod body 852. The washer 865 can be made of any suitable material including, but not limited to, silicon.

In the embodiment shown in FIG. 12, a seal housing 870 is positioned adjacent the back face 727 of the sector 710. The seal housing 870 has two O-rings 872, 873 to form a seal around the rod body 852. The O-rings include an O-ring 872 around the rod body 852 to form a seal between the rod body 852 and the seal housing 870 and an O-ring 873 between the seal housing 870 and the back face 727 of the sector 710 to form a seal therebetween.

The embodiment of FIG. 12 also shows the rod body 852 passing through the conductive body 622 of the cooling plate; however, those skilled in the art will understand that this is merely one possible configuration and that the rod body 852 does not need to pass through the cooling plate 620. The rod body 852 shown includes an enlarged upper end 856 within a frame 861 with a washer 866 therein. The frame 861 can be made of any suitable material including, but not limited to, quartz, aluminum or stainless steel. Since the frame 861 is not inside the sector, the use of a metallic material may be employed without metal contamination issues. The frame 861 can be connected to the conductive body 622, or other component, using screws 868, or other fastening components. A spring 880, or other compression component, can be used to provide additional support to the sector.

The reactive gas sectors 710, 720 can be suspended by any suitable number of suspension rods. In some embodiments, each of the reactive gas sectors 710, 720 are suspended by at least two suspension rods 850. In some embodiments, each of the reactive gas sectors 710, 720 are suspended by at least three suspension rods 850.

As shown in FIG. 6, a plurality of purge gas sectors 800 are axially arranged around the central axis 605. Each of the purge gas sectors 800 is positioned between reactive gas sectors 710, 720 so that each reactive gas sector 710, 720 is separated from adjacent reactive gas sectors by at least one purge gas sector 800. In some embodiments, more than one reactive gas sector can be positioned adjacent each other without a purge gas sector 800 therebetween.

Figure 13:
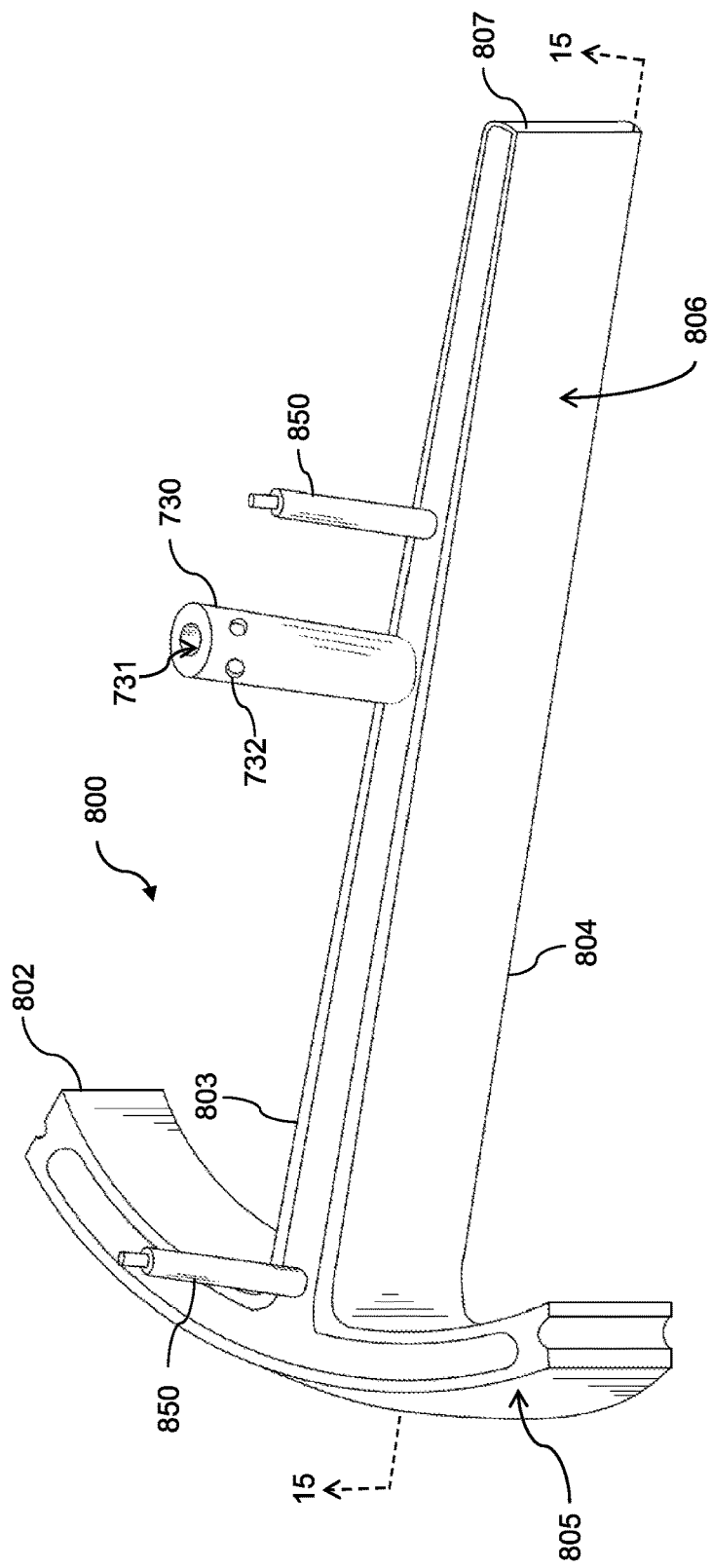
FIG. 13 shows a perspective view of a purge gas port in accordance with one or more embodiment of the disclosure.
Figure 14:
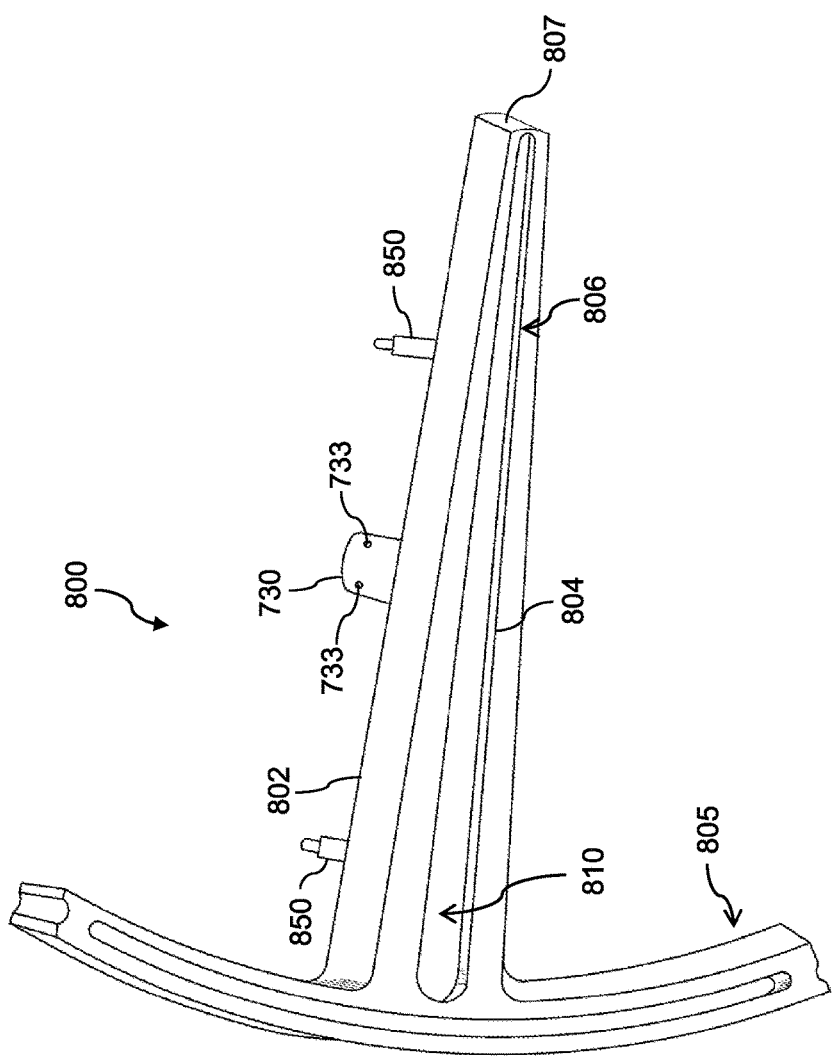
FIG. 14 shows a front perspective view of a purge gas port in accordance with one or more embodiment of the disclosure.
Figure 15:
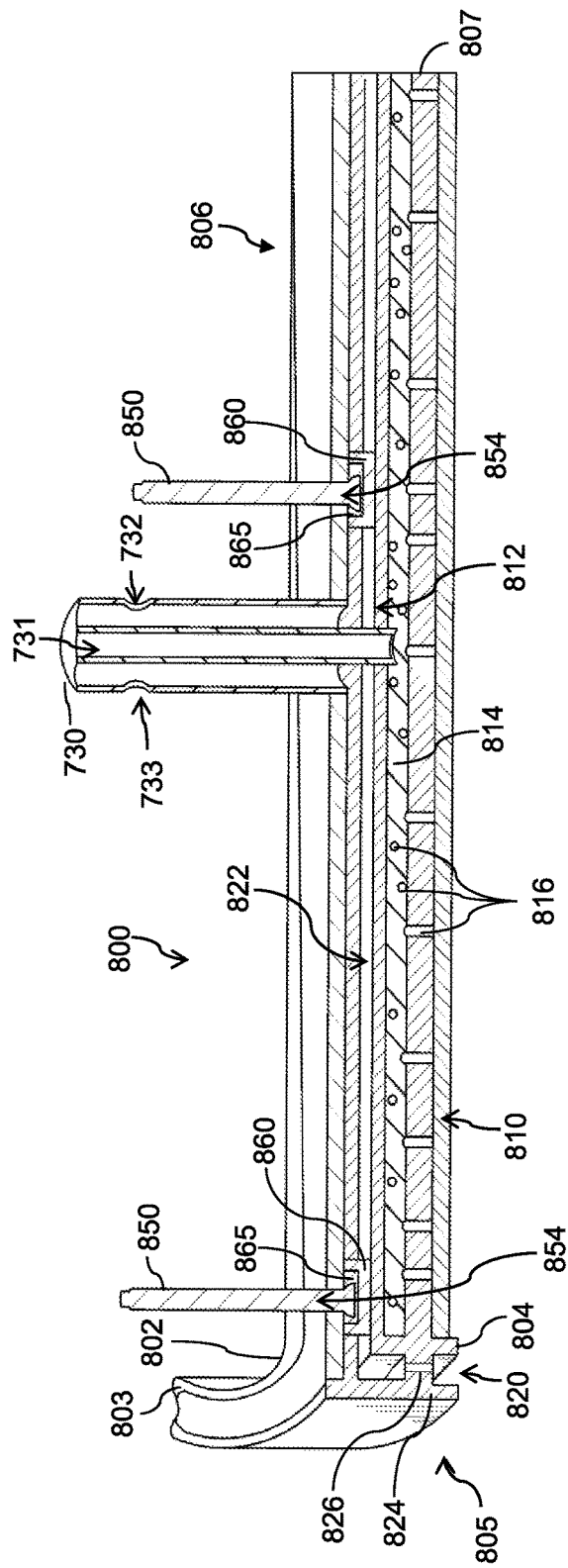
FIG. 15 shows a cross-sectional view of the purge gas port of FIG. 13 taken along line 15-15.
Figure 16:
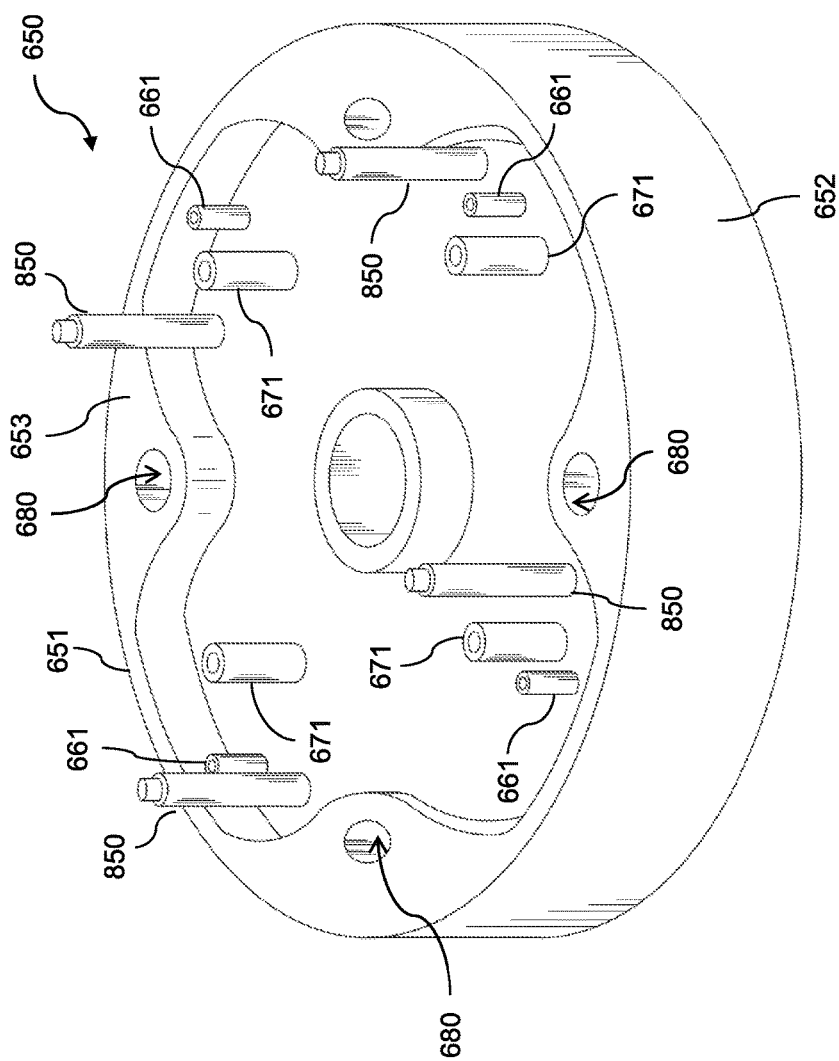
FIG. 16 shows a perspective view of a quartz puck in accordance with one or more embodiment of the disclosure.
Figure 17:
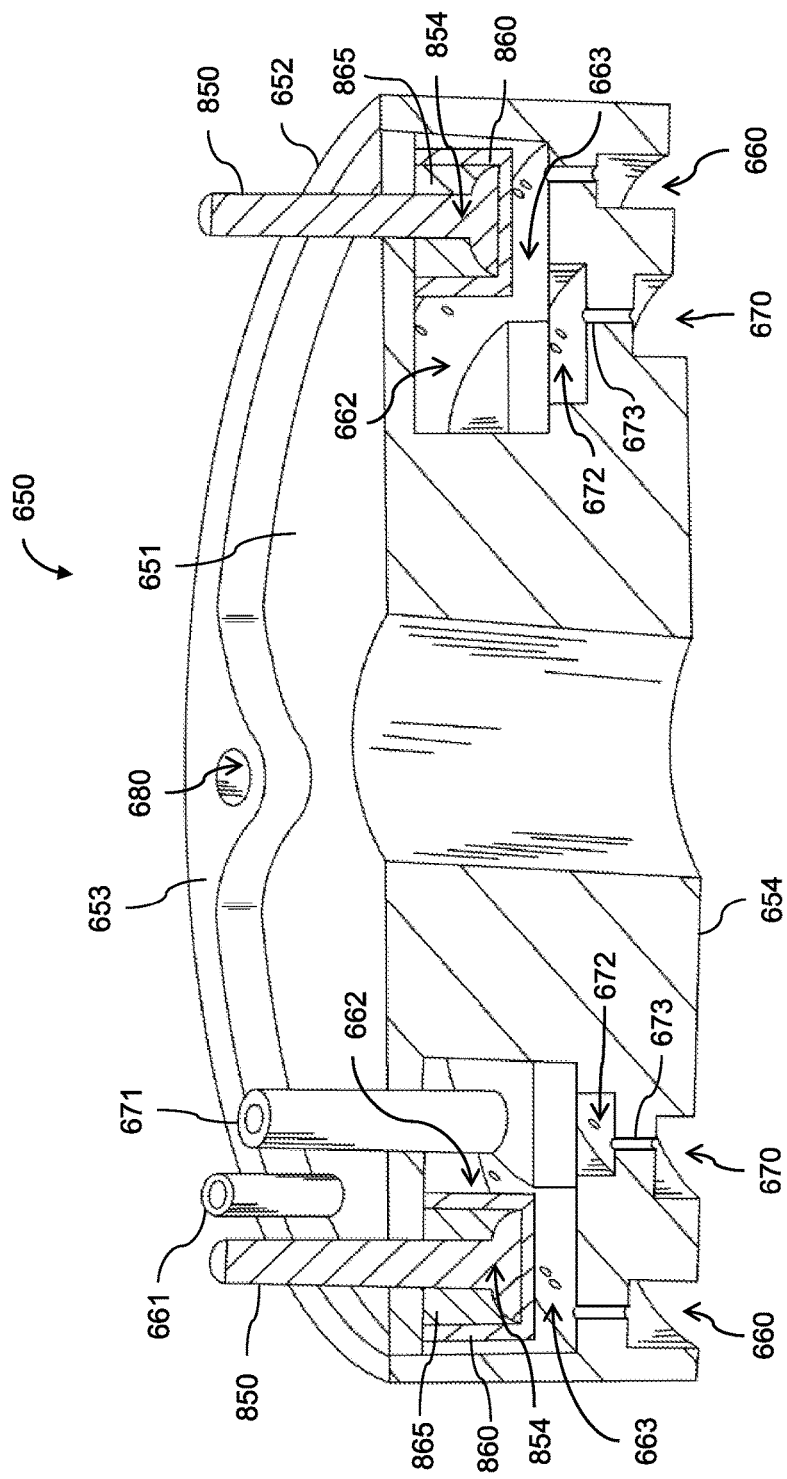
FIG. 17 shows a partial cross-sectional view of a quartz puck in accordance with one or more embodiment of the disclosure.

FIGS. 13 to 15 show purge gas sectors 800 in accordance with one or more embodiments of the disclosure. The purge gas sector 800 include a quartz housing 802 with a back face 803, a front face 804, an outer peripheral leg 805 and a radial leg 806 with an inner peripheral end 807. The purge gas sector 800 includes a coaxial gas inlet 730 in fluid communication with the housing 802. The coaxial gas inlet 730 is similar to that of the coaxial gas inlet of the reactive gas sector and has an inner tube 731 and an outer tube 732.

The inner tube 731 is in fluid communication with a purge gas port 810 in the front face 804 of the radial leg 806 of the housing 802. The embodiment shown in FIG. 15 has the inner tube 731 if fluid communication with a plenum 812. The plenum 812 has a diffuser plate 814 with a plurality of apertures 816 extending through the diffuser plate 814. A gas flowing through the inner tube 731 will pass into the plenum 812, flow through the apertures 816 in the diffuser plate 814 and out the front face 804 of the radial leg 806 of the housing 802 through the purge gas port 810.

The outer tube 732 is in fluid communication a purge gas port 820 in the front face 804 of the outer peripheral leg 805 of the housing 802. The embodiment shown in FIG. 15 has the outer tube 732 in fluid communication with a plenum 822. The plenum has a diffuser plate 824 with a plurality of apertures 826 extending through the diffuser plate 824. A gas flowing through the outer tube 732 will pass into the plenum 822, flow through the apertures 826 in the diffuser plate 824 and out the front face 804 of the outer peripheral leg 805 of the housing 802 through the purge gas port 820.

In some embodiments, each of the purge gas sectors 800 are suspended from the cooling plate 620 by at least two suspension rods 850. In some embodiments, each of the purge gas sectors 800 are suspended from the cooling plate 620 by at least three suspension rods 850.

Some embodiments, as shown in FIG. 6, include a quartz puck 650 at the central axis 605 of the gas distribution assembly 600. FIGS. 16 through 19 show a quartz puck 650 in accordance with one or more embodiment of the disclosure. The quartz puck 650 has a body 651 with an outer edge 652, a back face 653 and a front face 654. The quartz puck 650 can be positioned at and act as a central axis 605 so that each of the reactive gas sectors 710, 720 and purge gas sectors 800 are alternatingly arranged around an outer edge 652 of the quartz puck 650.

Figure 19:
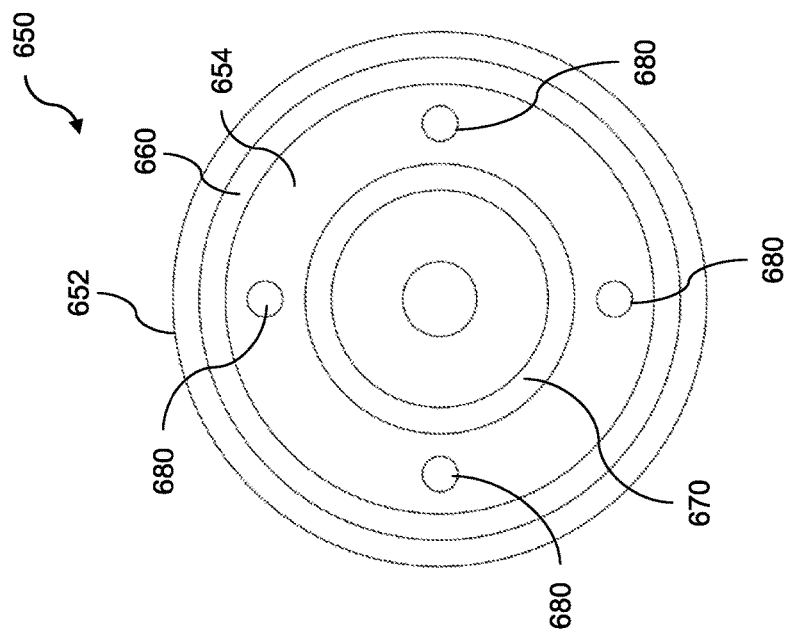
FIG. 19 shows a front face of a quartz puck in accordance with one or more embodiment of the disclosure.
Figure 18:
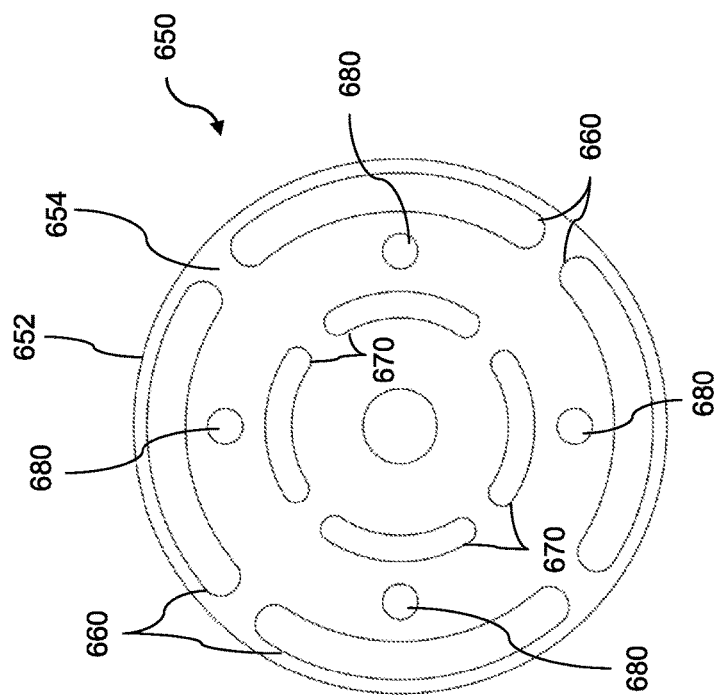
FIG. 18 shows a front face of a quartz puck in accordance with one or more embodiment of the disclosure.

The quartz puck 650 comprises at least one vacuum port 660 and at least one purge gas port 670. The quartz puck 650 of some embodiments comprises, as shown in FIG. 18, a plurality of vacuum ports 660 and purge gas ports 670. As shown in FIG. 19, some embodiments of the quartz puck 650 include one vacuum port 660 and one purge gas port 670. While not shown in FIG. 18 or 19, a plurality of apertures may be formed in the vacuum port 660 and/or purge gas port 670 to allow fluid communication between the ports and the gas or vacuum source.

A vacuum connection 661 passes through the back face 653 of the quartz puck 650 and is in fluid communication with a vacuum plenum 662. In the embodiment shown, a plurality of apertures 663 form a fluid connection between the vacuum plenum 662 and the vacuum port 660 in the front face 654 of the quartz puck 650.

A purge gas connection 671 passes through the back face 653 of the quartz puck 650 and is in fluid communication with a purge gas plenum 672. In the embodiment shown, a plurality of apertures 673 form a fluid connection between the purge gas plenum 672 and the purge gas port 670 in the front face 654 of the quartz puck 650.

The quartz puck 650 can be suspended from the cooling plate 620 by a plurality of suspension rods 850. In some embodiments, the quartz puck 650 is suspended from the cooling plate 620 by at least three suspension rods 850. In some embodiments, the quartz puck 650 is suspended from the cooling plate 620 by four, or at least four, suspension rods 850.

According to one or more embodiments, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited.

Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas distribution assembly comprising:
   a cooling plate; and
   a plurality of reactive gas sectors axially arranged around a central axis;
   a plurality of purge gas sectors axially arranged around the central axis, each of the purge gas sectors positioned between reactive gas sectors each of the reactive gas sectors comprising
      a quartz wedge-shaped housing having a back face and a front face and a coaxial gas inlet in fluid communication with the wedge-shaped housing
      the coaxial gas inlet having an inner tube and an outer tube, the inner tube in fluid communication with a plenum within the quartz wedge-shaped housing and the reactive gas sector including a quartz diffuser plate adjacent the plenum, the diffuser plate comprising a plurality of apertures to allow a gas flowing through the inner tube to pass into the plenum and diffuse through the plurality of apertures and out a reactive gas port in the front face of the quartz wedge-shaped housing into a process region of a processing chamber,
      the outer tube is in fluid communication with a vacuum port in the front face of the quartz wedge-shaped housing, the vacuum port surrounding the diffuser plate of the reactive gas port,
      each reactive gas sectors suspended from the cooling plate by a plurality of suspension rods, each suspension rod comprising a metal rod body that passes through an opening in the back face of the quartz wedge-shaped housing, the rod body having an enlarged lower end positioned within a quartz frame within the quartz wedge-shaped housing, and a silicon washer is positioned within the quartz frame around the enlarged lower end; and
   a quartz puck at the central axis.

2. The gas distribution assembly of claim 1, wherein each reactive gas sector is suspended from the cooling plate by at least three suspension rods.

3. The gas distribution assembly of claim 1, the quartz puck comprises a housing with at least one vacuum port and at least one purge gas port and is suspended from the cooling plate by a plurality of suspension rods, each suspension rod comprising a metal rod body that passes through an opening in a back face of the housing, the rod body having an enlarged lower end positioned within a quartz frame within the housing, and a silicon washer is positioned within the quartz frame around the enlarged lower end.

4. The gas distribution assembly of claim 3, wherein the cooling plate comprises a conductive body with a channel therethrough to flow a fluid from an inlet end of the channel to an outlet end of the channel.

5. A gas distribution assembly comprising:
   a cooling plate; and
   a plurality of reactive gas sectors axially arranged around a central axis;
   a plurality of purge gas sectors axially arranged around the central axis, each of the purge gas sectors positioned between reactive gas sectors, each of the plurality of purge gas sectors comprising
      a quartz housing with a back face, a front face, an outer peripheral leg, a radial leg and a coaxial gas inlet in fluid communication with the housing, the coaxial gas inlet having an inner tube and an outer tube,
      the inner tube in fluid communication with a purge gas port in the front face of the radial leg of the housing,
      the outer tube in fluid communication a purge gas port in the front face of the outer peripheral leg of the housing,
      each of the purge gas sectors suspended from the cooling plate by a plurality of suspension rods, each suspension rod comprising a metal rod body that passes through an opening in the back face of the housing, the rod body having an enlarged lower end positioned within a quartz frame within the housing, and a silicon washer is positioned within the quartz frame around the enlarged lower end; and
   a quartz puck at the central axis.

6. The gas distribution assembly of claim 5, wherein each purge gas sector is suspended from the cooling plate by at least two suspension rods.

7. The gas distribution assembly of claim 5, the quartz puck comprises a housing with at least one vacuum port and at least one purge gas port and is suspended from the cooling plate by a plurality of suspension rods, each suspension rod comprising a metal rod body that passes through an opening in a back face of the housing, the rod body having an enlarged lower end positioned within a quartz frame within the housing, and a silicon washer is positioned within the quartz frame around the enlarged lower end.

8. The gas distribution assembly of claim 7, wherein the cooling plate comprises a conductive body with a channel therethrough to flow a fluid from an inlet end of the channel to an outlet end of the channel.

9. A gas distribution assembly comprising:
   a cooling plate having a conductive body with a channel therethrough to flow a fluid from an inlet end of the channel to an outlet end of the channel; and
   a plurality of reactive gas sectors axially arranged around a central axis, each of the reactive gas sectors comprising a quartz wedge-shaped housing with a back face and a front face and a coaxial gas inlet in fluid communication with the wedge-shaped housing, the coaxial gas inlet having an inner tube and an outer tube, the inner tube is in fluid communication with a plenum within the wedge-shaped housing and the reactive gas sector includes a diffuser plate adjacent the plenum, the diffuser plate comprising a plurality of apertures to allow a gas flowing through the inner tube to pass into the plenum and diffuse through the plurality of apertures and out a reactive gas port in the front face of the wedge-shaped housing into a process region of a processing chamber, the outer tube is in fluid communication with a vacuum port in the front face of the wedge-shaped housing, the vacuum port surrounding the diffuser plate of the reactive gas port, each reactive gas sector suspended from the cooling plate by at least three suspension rods, each suspension rod comprises a metal rod body that passes through an opening in the back face of the wedge-shaped housing, the rod body having an enlarged lower end positioned within a quartz frame within the wedge-shaped housing, and a silicon washer is positioned within the quartz frame around the enlarged lower end;

a plurality of purge gas sectors axially arranged around the central axis, each of the purge gas sectors positioned between reactive gas sectors, each purge gas sector comprising a quartz housing with a back face, a front face, an outer peripheral leg, a radial leg and a coaxial gas inlet in fluid communication with the housing, the coaxial gas inlet having an inner tube and an outer tube, the inner tube is in fluid communication with a purge gas port in the front face of the radial leg of the housing, the outer tube is in fluid communication a purge gas port in the front face of the outer peripheral leg of the housing, each of the purge gas sectors suspended from the cooling plate by at least two suspension rods, each suspension rod comprises a metal rod body that passes through an opening in the back face of the housing, the rod body having an enlarged lower end positioned within a quartz frame within the housing, and a silicon washer is positioned within the quartz frame around the enlarged lower end; and a quartz puck at the central axis, the plurality of reactive gas sectors and purge gas sectors alternatingly arranged around an outer edge of the quartz puck, the quartz puck comprises at least one vacuum port and at least one purge gas port and is suspended from the cooling plate by a plurality of suspension rods, each suspension rod comprising a metal rod body that passes through an opening in a back face of the housing, the rod body having an enlarged lower end positioned within a quartz frame within the housing, and a silicon washer is positioned within the quartz frame around the enlarged lower end.

10. A processing chamber comprising:

a gas distribution assembly comprising a cooling plate, a quartz puck suspended from a central axis of the cooling plate by a plurality of suspension rods, the quartz puck comprising a plurality of vacuum ports and purge gas ports in a front face of the quartz puck, a plurality of reactive gas sectors axially arranged around an outer edge of the quartz puck, each reactive gas sector suspended from the cooling plate by at least three suspension rods, each of the reactive gas sectors comprising a quartz wedge-shaped housing with a back face and a front face and a coaxial gas inlet in fluid communication with the wedge-shaped housing, the coaxial gas inlet having an inner tube and an outer tube, the inner tube is in fluid communication with a plenum within the wedge-shaped housing and the reactive gas sector includes a diffuser plate adjacent the plenum, the diffuser plate comprising a plurality of apertures to allow a gas flowing through the inner tube to pass into the plenum and diffuse through the plurality of apertures and out a reactive gas port in the front face of the wedge-shaped housing into a process region of the processing chamber, the outer tube is in fluid communication with a vacuum port in the front face of the wedge-shaped housing, the vacuum port surrounding the diffuser plate of the reactive gas port, a plurality of purge gas sectors axially arranged around the outer edge of the quartz puck and alternating with the reactive gas sectors, each purge gas sector comprising a quartz housing with a back face, a front face, an outer peripheral leg, a radial leg and a coaxial gas inlet in fluid communication with the housing, the coaxial gas inlet having an inner tube and an outer tube, the inner tube is in fluid communication with a purge gas port in the front face of the radial leg of the housing, the outer tube is in fluid communication a purge gas port in the front face of the outer peripheral leg of the housing, each suspension rod comprises a metal rod body that passes through an opening in the back face of the housing, the rod body having an enlarged lower end positioned within a quartz frame within the housing, and a silicon washer is positioned within the quartz frame around the enlarged lower end; and a susceptor assembly having a top surface comprising a plurality of recesses therein, each recess sized to support a substrate, the susceptor assembly having a support post to rotate and move the susceptor assembly to form a gap between the gas distribution assembly and the top surface of the susceptor assembly to form a gap.

\* \* \* \* \*